(12) United States Patent
Reynolds et al.

(10) Patent No.: US 11,508,674 B2
(45) Date of Patent: Nov. 22, 2022

(54) HIGH POWER THERMALLY CONDUCTIVE RADIO FREQUENCY ABSORBERS

(71) Applicant: THE BOEING COMPANY, Chicago, IL (US)

(72) Inventors: Robert L. Reynolds, Torrance, CA (US); Martin W. Bieti, Los Angeles, CA (US); Robert Choo, Torrance, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 15/370,974

(22) Filed: Dec. 6, 2016

(65) Prior Publication Data

US 2018/0158754 A1 Jun. 7, 2018

(51) Int. Cl.
*H01L 23/66* (2006.01)
*H01L 23/367* (2006.01)
*H01Q 17/00* (2006.01)

(52) U.S. Cl.
CPC .......... *H01L 23/66* (2013.01); *H01L 23/367* (2013.01); *H01L 2223/6677* (2013.01); *H01Q 17/008* (2013.01)

(58) Field of Classification Search
CPC ................. H01L 23/66; H01L 23/367; H01L 2223/6677; H01Q 17/008
USPC ...................................................... 257/706
See application file for complete search history.

(56) References Cited

U.S. PATENT DOCUMENTS

| | | | |
|---|---|---|---|
| 2,977,591 A * | 3/1961 | Tanner | H01Q 17/002 342/1 |
| 3,036,280 A | 5/1962 | Raymond | |
| 3,641,465 A | 2/1972 | Price et al. | |
| 3,938,152 A * | 2/1976 | Grimes | H01Q 17/004 342/1 |
| 4,012,738 A * | 3/1977 | Wright | H01Q 17/004 342/1 |
| 5,125,992 A * | 6/1992 | Hubbard | H01Q 17/00 156/151 |
| 5,202,688 A * | 4/1993 | Hubbard | H01Q 17/00 342/1 |
| 5,537,116 A * | 7/1996 | Ishino | H01Q 17/00 342/1 |
| 5,731,777 A * | 3/1998 | Reynolds | H01Q 17/001 342/4 |
| 6,043,769 A * | 3/2000 | Rowe | H01Q 17/00 342/1 |

(Continued)

OTHER PUBLICATIONS

Costa, F. et al.; "Analysis and Design of Ultra Thin Electromagnetic Absorbers Comprising Resistively Loaded High Impedance Surfaces," IEEE Transactions on Antennas and Propagation, vol. 58, No. 5, pp. 1551-1558, May 2010.

(Continued)

*Primary Examiner* — Duy T Nguyen (57) ABSTRACT

Radio frequency ("RF") absorbing devices used as RF termination devices or free space absorbers, for example, are formed with a planar wafer made of an inorganic thermally conductive material. The planar wafer has a first surface and a second surface opposite the first surface. A metallized resistive film is disposed on the first surface. A metallized reflective heat sink is disposed on the second surface.

20 Claims, 7 Drawing Sheets

(56) References Cited

U.S. PATENT DOCUMENTS

| | | | | |
|---|---|---|---|---|
| 6,705,388 | B1* | 3/2004 | Sorgo | H01L 23/3731 165/185 |
| 6,738,008 | B1* | 5/2004 | Liu | G01R 29/105 342/4 |
| 7,695,803 | B2* | 4/2010 | Kasabo | B32B 29/08 428/182 |
| 8,031,104 | B2* | 10/2011 | Janis | H01Q 17/00 342/1 |
| 8,471,470 | B1* | 6/2013 | Wedding | H01J 47/02 313/582 |
| 9,470,732 | B2* | 10/2016 | Reynolds | G01R 29/10 |
| 9,568,367 | B2* | 2/2017 | Nemirovsky | G01J 5/02 |
| 10,097,285 | B2* | 10/2018 | Reynolds | H04B 17/12 |
| 2002/0011660 | A1 | 1/2002 | Ebihara et al. | |
| 2004/0090358 | A1* | 5/2004 | Liu | G01R 29/105 342/1 |
| 2005/0266231 | A1* | 12/2005 | Lin | G02F 1/133385 428/317.9 |
| 2006/0246261 | A1* | 11/2006 | Kasabo | B32B 29/08 428/182 |
| 2010/0090879 | A1* | 4/2010 | Janis | H01Q 17/00 342/1 |
| 2011/0298673 | A1* | 12/2011 | Zhang | G01R 29/0821 343/703 |
| 2013/0142215 | A1* | 6/2013 | Nemirovsky | G01J 5/02 374/121 |
| 2015/0323581 | A1* | 11/2015 | Reynolds | G01R 29/10 343/703 |
| 2016/0093552 | A1* | 3/2016 | Venugopal | H01L 21/4871 257/29 |
| 2016/0254600 | A1* | 9/2016 | Fixter | H01Q 17/002 428/323 |
| 2018/0109333 | A1* | 4/2018 | Reynolds | H04B 17/102 |
| 2018/0109334 | A1* | 4/2018 | Reynolds | H04B 17/12 |
| 2018/0158754 | A1* | 6/2018 | Reynolds | H01L 23/66 |

OTHER PUBLICATIONS http://www.cumingmicrowave.com/products/carbon-based-foam-absorbers/frequency-tuned-salisburyscreen-absorber.html, one page, printed on Dec. 19, 2019.

http://www.emc-rflabs.com/Passive-Components/Diamond-Rf-Resistives/Thermal-Management, 8 pgs, printed on Dec. 19, 2019.

http://www.microwaves101.com/encyclopedias/thin-film-resistors, 2 pgs., printed on Dec. 19, 2019.

http://www.mpdigest.com/issue/Articles/2012/Apr/emerson/, 6 pgs., printed on Dec. 19, 2019.

http://www.resistorguide.com/thin-and-thick-film/, 6 pgs. printed on Dec. 19, 2019.

"ECCOSORB Principles" https://web.archive.org/web/20120719023817/http://www.eccosorb.com:80/notes-eccosorb-principles.htm, printed Aug. 19, 20, pp. 1-9.

Dash, "How RF Anechoic Chambers Work", Copyright 1999, 2005 Ampyx LLC, pp. 1-9.

Sohrab et al., "A Thin Wideband Absorber with Uniform Response in X-band" Copyright 2012, IEEE, pp. 1-3.

\* cited by examiner

HIGH POWER THERMALLY CONDUCTIVE RADIO FREQUENCY ABSORBERS

BACKGROUND

1. Field

The present disclosure relates generally to radio frequency ("RF") terminations and absorbers, and more particularly, to thermally conductive RF terminations and absorbers suitable for high power applications.

2. Related Art

RF radiative terminations are finding increasing use in high power and high frequency applications that require the capability of dissipating high heat levels. For example, RF terminations may be used in terminating high-power antenna horn apertures in a satellite testing phase or in terminating high power flight waveguides, which may involve operation in a vacuum. Existing terminations in these applications have limited heat dissipation capability, are subject to potential thermal/outgassing breakdown, and cause passive intermodulation (PIM). RF free space absorbers may be susceptible to similar issues in some applications.

Currently, silicon carbide based terminations are used in high power RF applications but there are inherent risks and limitations. The major drawback with silicon carbide is poor thermal dissipation. The material can tolerate extreme temperatures but fails to conduct heat efficiently in order to be safely dissipated. In typical cases, a bond material, such as room temperature vulcanization (RTV) silicone rubber, is used to affix and improve thermal dissipation but this results in another risk of vaporizing the bond and creating high power ionization breakdown in the waveguide that will potentially destroy the transmission path. Silicon carbide terminations are also inherently non-linear and therefore cause undesirable passive intermodulation (PIM).

In view of the above, there is a need for a reliable, compact, high frequency RF radiative termination that is capable of extremely high RF flux intensities.

BRIEF DESCRIPTION OF THE FIGURES

This disclosure may be better understood by referring to the following figures. The components in the figures are not necessarily to scale, emphasis instead being placed upon illustrating the principles of the disclosure. In the figures, like reference numerals designate corresponding parts throughout the different views.

DETAILED DESCRIPTION

Described below are examples of devices configured to operate as loads or terminations in high frequency radiated RF configurations where organic materials present a risk of failure. The described devices use thermally conductive inorganic metallized ceramic termination materials to provide a thermally conductive path to efficiently and safely dissipate heat even with extremely high RF power. The described materials may be used in a Salisbury Screen configuration to achieve the same safety and thermal dissipation efficiency in free space or waveguide radiative terminations. Salisbury screen absorbers are inherently narrow band so usefulness may be limited in wideband applications. However, a limited bandwidth is acceptable in many applications. The described materials may be used in a Jaumann Absorber, which is typically configured as a multi-layered configuration, with resistively loaded high impedance planar surfaces where extended bandwidth is required.

Figure 1A:
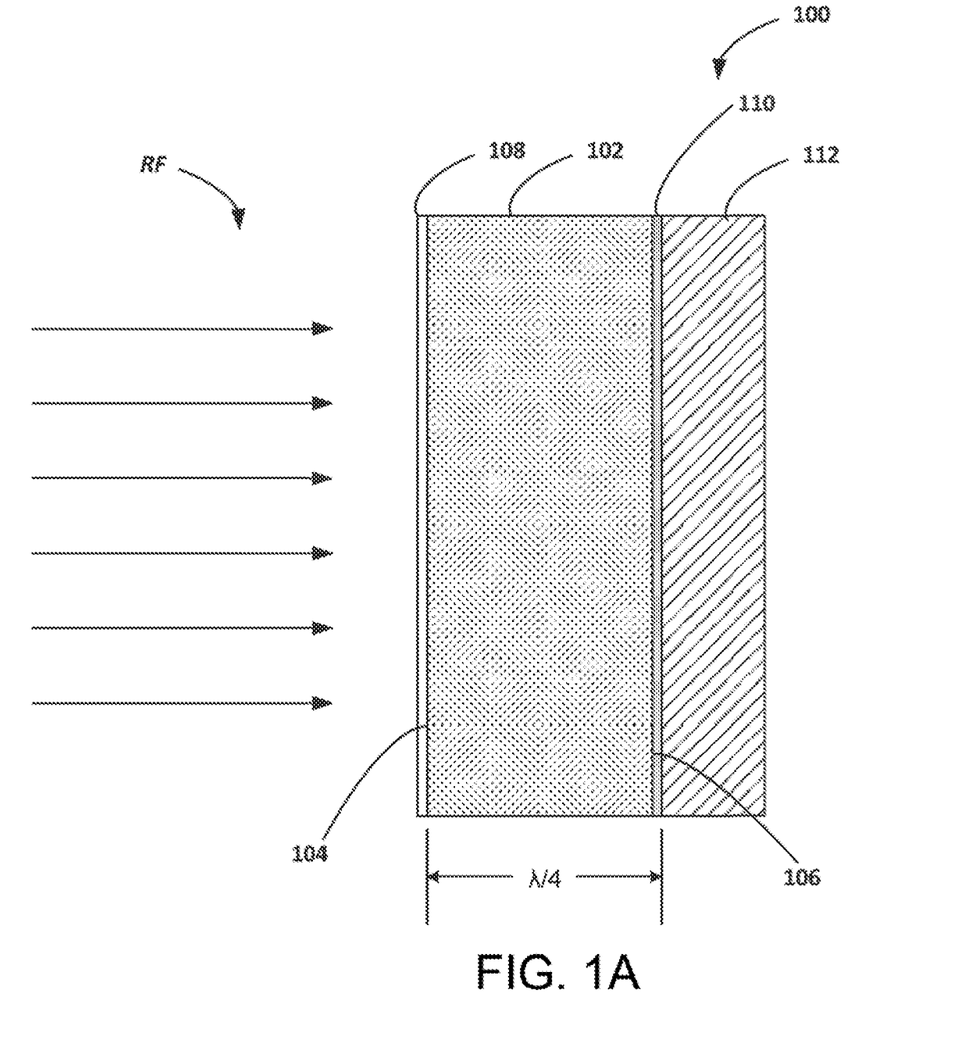
FIGS. 1A and 1B are a schematic diagrams of an example RF termination configured as a load in an antenna horn aperture or in a waveguide conducting a high frequency RF signal.
Figure 1B:
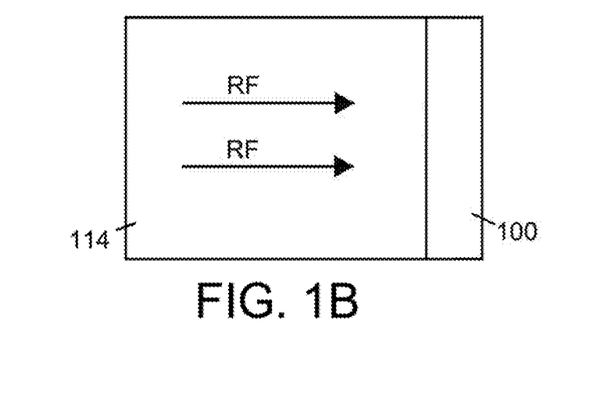

FIGS. 1A and 1B are schematic diagrams of an example RF termination 100 configured as a load in an antenna horn aperture or waveguide 114 conducting a high frequency RF signal. The RF termination 100 includes a planar wafer 102 made of an inorganic thermally conductive material. The planar wafer 102 has a first surface 104 and a second surface 106 opposite the first surface 104. The planar wafer 102 also includes a metallized resistive film 108 disposed on the first surface 104 and a metallized reflective heat sink 112 disposed on the second surface 106. In some examples, a pressure sensitive adhesive 110 may be used to attach the metallized heat sink 112 to the planar wafer 102. The pressure sensitive adhesive 110 used should be thin (~2 mils) and able to tolerate high operating temperatures. Other means of attachment may be used such as a thermally conductive bond depending on the requirements of a specific application.

The configuration shown in FIGS. 1A and 1B is an example of a configuration based on a Salisbury Screen absorber. In use, the RF termination 100 in FIGS. 1A and B may be configured to receive RF signals at the surface of the metallized resistive film 108. The metallized resistive film 108 is separated from the metallized reflective heat sink 112 by the thickness of the planar wafer 102. The radio frequency thickness of the wafer in some examples may be $\lambda/4$ where $\lambda$ is the wavelength of the RF signal for which the RF termination 100 serves as a load.

In example implementations, the inorganic thermally conductive material is a suitable ceramic material. The metallized reflective heat sink 112 may be made of aluminum or copper, and may be configured in a suitable heat sink configuration optimized to assist in dissipating heat. The metallized resistive film 108 is made of a metallized resistive material having dimensions where the termination impedance of the radiative termination device matches a system impedance. For termination of a waveguide, the termination impedance would match the system impedance, which is about 400 to 600 $\Omega$/square in a full height waveguide depending on frequency.

Figure 2:
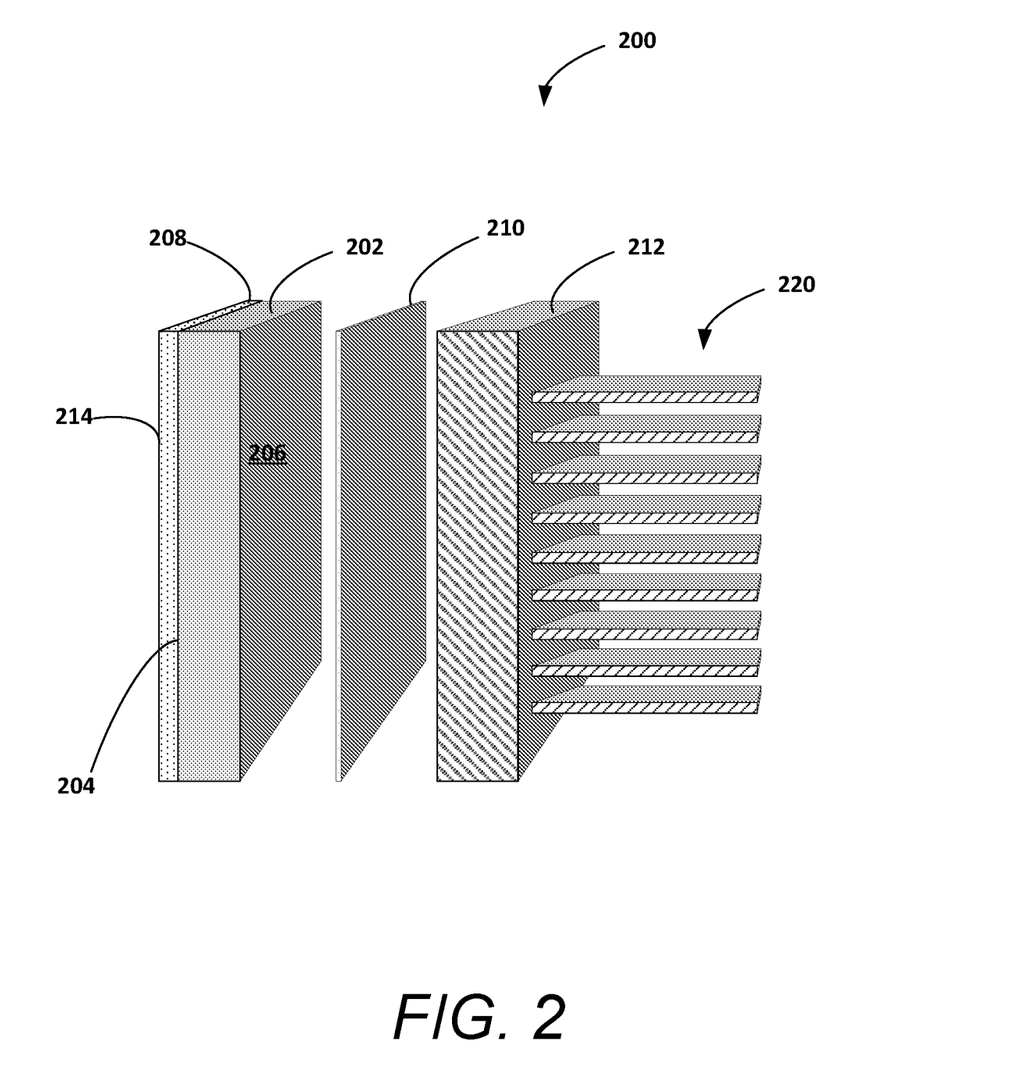
FIG. 2 is an exploded view of the RF termination in FIG. 1A.

FIG. 2 is an exploded view of an example of an RF termination 200 illustrating methods of manufacturing an example RF termination device. The RF termination 200 includes a planar wafer 202 having a first surface 204 and a second surface 206 opposite the first surface 204. The planar wafer 202 includes a metallized resistive film 208 disposed on the first surface 204 and a metallized reflective heat sink 212 disposed on the second surface 206.

In the example illustrated in FIG. 2, the metallized resistive film 208 may be a metal, such as nickel-chromium (NiCr) or stainless steel. The metallized resistive film 208 may be formed on the planar wafer using vacuum deposition in a geometry that provides an impedance of about 400 to 600 Ω/square where the RF termination is a used as a load for a full height waveguide radiative applications or 377 Ω/square for free space radiative applications. A protective coating of high temperature (2000° F.) paint 214 may be required to protect the resistive film from abrasion and oxidation.

The planar wafer 202 may be made of a suitable ceramic material, such as, for example, boron nitride. Other suitable materials may include: silicon dioxide, diamond, Beryllium Oxide, Reaction Bonded Silicon Nitride (RBSN), Aluminum Nitride, Silicon Nitride, MACOR® material, Mullite, and Aluminum Oxide (MACOR is a registered trademark of CORNING INCORPORATED CORPORATION of CORNING, NEW YORK). The material used for the planar wafer 202 should have the following characteristics:

1. Ability to handle required mechanical stress.
2. Low dielectric constant.
3. Low loss tangent.
4. Good thermal conductivity.
5. Low (zero, if possible) water absorption.
6. Low density.

Another factor that may be considered in a given application is cost. In general, the dielectric ceramic material selected in a given application would depend on the requirements of the application given the above listed general desired characteristics.

More specific examples of suitable materials along with their characteristics are listed below in Table A.

the pressure sensitive adhesive 210 may be replaced by other ways of attaching a metal to a ceramic. In one example, the metallized reflective heat sink 212 may be formed on the second surface 206 of the planar wafer 202 by vacuum depositing the metal on the planar wafer 202, or by electroplating the metal on the second surface 206 of the planar wafer 202.

One example implementation of the RF termination device 200 shown in FIG. 2 may be composed of the materials shown in TABLE B.

TABLE B

| Component | Example |
|---|---|
| Metallized resistive film 208 | NiCr resistive film configured with geometry that provides 377 Ω/square NiCr is vacuum deposited on the planar wafer 202. |
| Planar Wafer Thermally Conductive Material 202 | Boron Nitride with thickness of λ/4. |
| Pressure Sensitive Adhesive 210 | is 3M 966 organic bonding material, thickness about 2 mil. |
| Metallized heat sink 212 | Aluminum base with 7 1.4" × 0.2" aluminum fins 220 mounted on a 0.2" thick base. |
| Resistive film 2000° F. protective paint | Rustoleum High Heat 248903 |

Figure 3:
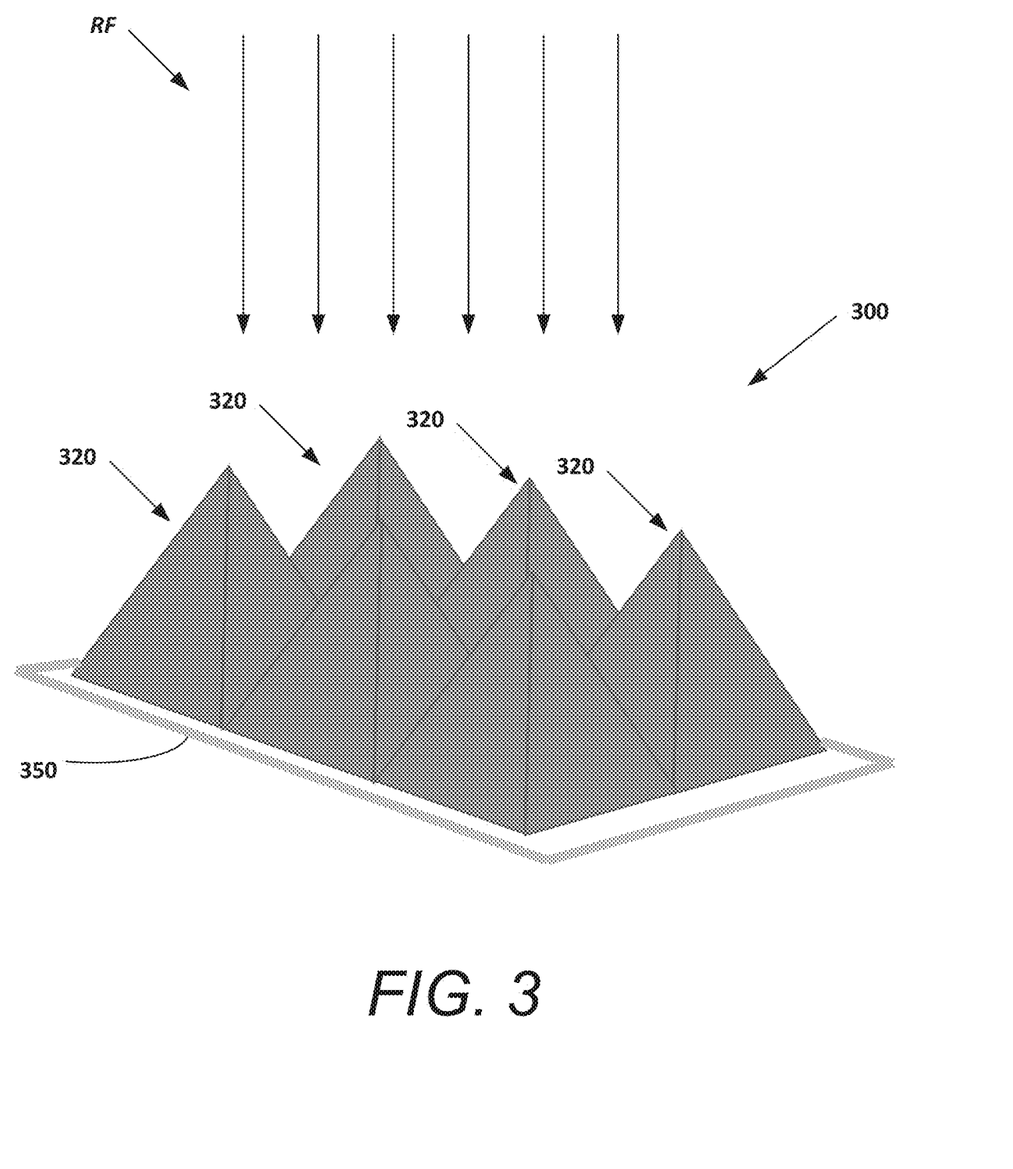
FIG. 3 is an example of a free space absorber for use in high frequency and high power applications.

FIG. 3 is an example of a free space absorber 300 for use in high frequency and high power applications. The free space absorber 300 includes a plurality of three-dimensional structures 320 having RF absorbing properties as described below. The three-dimensional structures 320 are mounted on a heat sink 350. The three-dimensional structures 320 may be of any suitable shape including a plurality of fins as in U.S. Pat. No. 5,731,777, the contents of which are incorpo-

TABLE A

| Dielectric support material | Dielectric Constant | Loss Tangent | Thermal Conductivity W/m-K | Flexural Strength Mega-pascal (MPa) | Density g/cc | % Water Absorption |
|---|---|---|---|---|---|---|
| Silicon Dioxide (99.99% fused quartz) | 3.8 | 0.00075 | 2 | | 2.20 | 0.00 |
| Boron Nitride (HBN) | 4.2 | 0.00020 | 33 | 76 | 2.00 | 3.50 |
| Diamond | 5.7 | 0.00020 | 2000 | | 3.52 | 0.00 |
| MACOR ® material | 6.0 | 0.00500 | 1.5 | | 2.52 | |
| Mullite (3Al2O3•2SiO2) | 6.0 | 0.00200 | 3.5 | 170 | 2.80 | 0.00 |
| Beryllium Oxide (99.5%) | 6.5 | 0.00040 | 188 | 175 | 2.85 | 0.00 |
| RBSN | 8.0 | | 42 | 700 | 3.25 | 0.00 |
| Aluminum Nitride (99%) | 8.7 | 0.00070 | 170 | 300 | 3.26 | 0.00 |
| Silicon Nitride (Hot Pressed) | 9.0 | | 42 | 700 | 3.10 | 0.00 |
| Aluminum Oxide (99.9% Alumina) | 9.6 | 0.00080 | 30 | 550 | 3.97 | 0.00 |

The metallized reflective heat sink 212 may be made of aluminum, copper, or other suitable metal. The metallized reflective heat sink 212 in FIG. 2 includes fins 220 extending perpendicularly from the outer surface of the metallized reflective heat sink 212. Such fins 220 are commonly used components of known heat sinks. Other structures that may be used include heat pipes and liquid cooling channels The example RF termination device 200 in FIG. 2 uses a pressure sensitive adhesive 210 to attach the metallized heat sink 212 to the planar wafer 202. In one example implementation, the pressure sensitive adhesive 210 may be the organic bond material 3M 966. In some implementations, rated herein. The three-dimensional structures 320 shown in FIG. 3 are pyramidal with the points of each pyramidal structure oriented perpendicular to the plane formed by the heat sink 350.

The free space absorber 300 is oriented to receive high frequency RF signals in a direction that is substantially perpendicular to the plane formed by the heat sink 350. The pyramidal shape provides an impedance gradient for a more compete transition from free space to the dissipative medium. The RF signal encounters a smoothly changing ratio of medium to the adjacent free space. Free space absorbers having a plurality of three-dimensional structures such as the free space absorber 300 in FIG. 3 are well-known. Those of ordinary skill in the art would know how to dimension the three-dimensional structures 320 and the resistive film impedance according to the wavelength of the RF signal to achieve a minimal reflection back into the free space through which the RF signal is received. The three-dimensional structure 320 may be of any shape, although pyramids, cones or other structures providing a point or edge would be preferred.

Figure 4A:
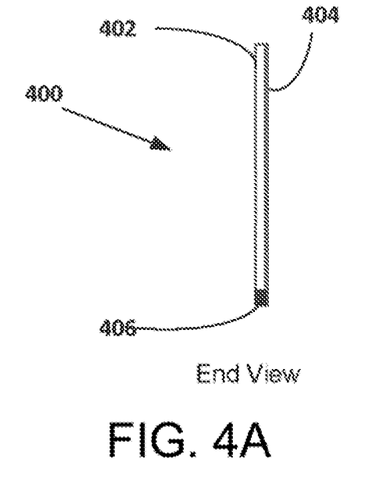
FIGS. 4A-4E depict components of the RF free space absorber in FIG. 3.
Figure 4B:
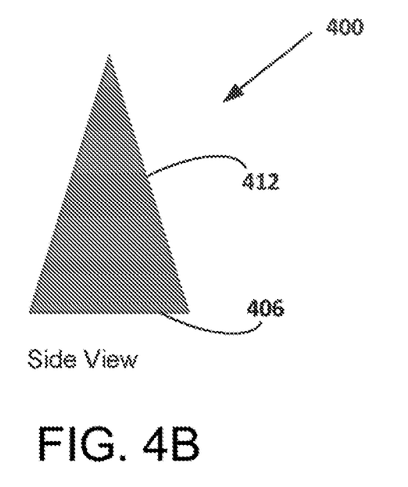
Figure 4C:
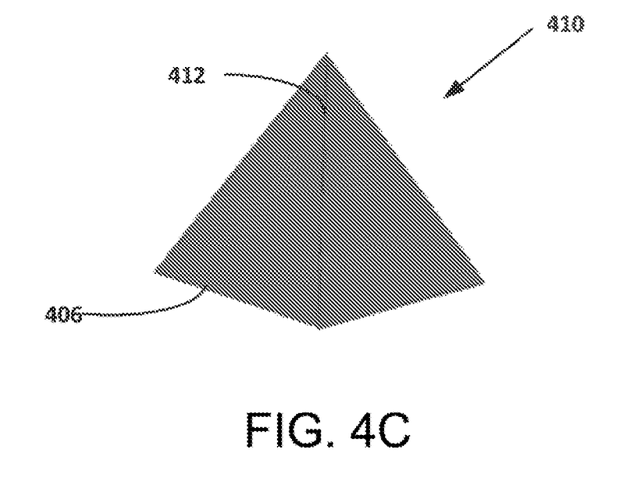

FIGS. 4A-4E depict components of the RF free space absorber 300 in FIG. 3. Turning to FIGS. 4A and 4B, the three-dimensional structure 320 (in FIG. 3) may be formed with a plurality of wafer members 400. Each wafer member 400 may be made of an inorganic thermally conductive material 402 and formed with a bottom edge 406. A metallized resistive film 404 maybe formed on a first surface of the wafer member 400. The bottom edge 406 of each wafer member 400 may include a deposited or plated metallized surface, which may be made of copper, for example. The wafer members 400 may be configured to wrap around to form a circular bottom edge and come to a point so that the three-dimensional structure is a cone. The wafer member 400 in FIG. 4B may have side edges 412, which may be joined to other side edges 412 of other wafer members to form a pyramid structure 410 as shown in FIG. 4C. The three-dimensional structure, such as for example, the pyramidal structure 410 in FIG. 4C, may be formed so that the bottom edges 406 of each wafer member 400 is substantially coplanar. The wafer members 400 of the three-dimensional structure are positioned such that the metallized resistive film 404 forms an RF absorbing side on the surface of the free space absorber receiving the RF signal.

Figure 4D:
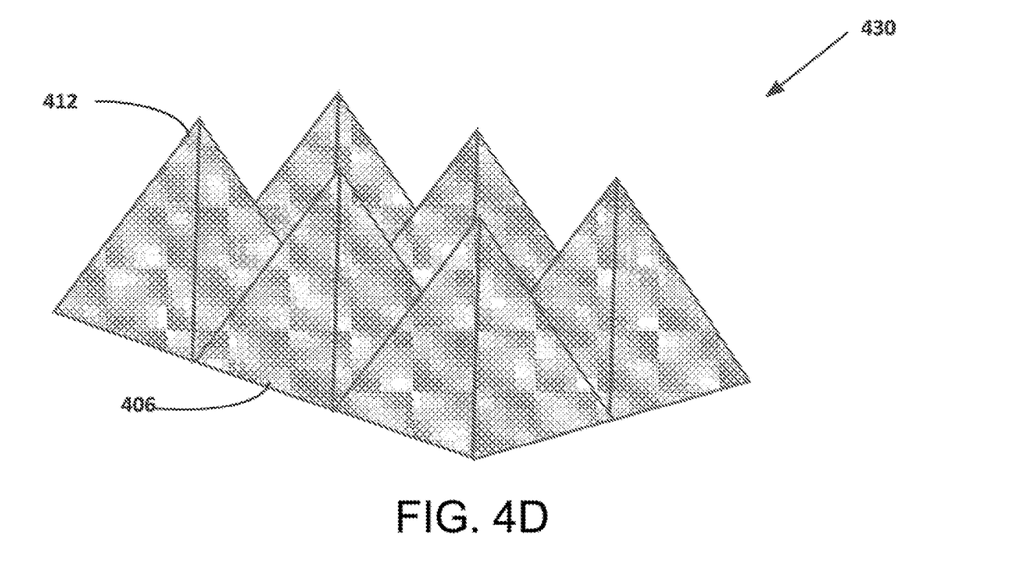

Each three-dimensional structure 410 may be positioned on a plane to form an array of three-dimensional structures. FIG. 4D shows an example of an array 430 of pyramidal structures 410 positioned substantially edge-to-edge at the bottom edges 406 of each pyramid. The bottom edges 406 of the pyramidal structures 410 may or may not touch depending on the RF absorption requirements of the free space absorber.

Figure 4E:
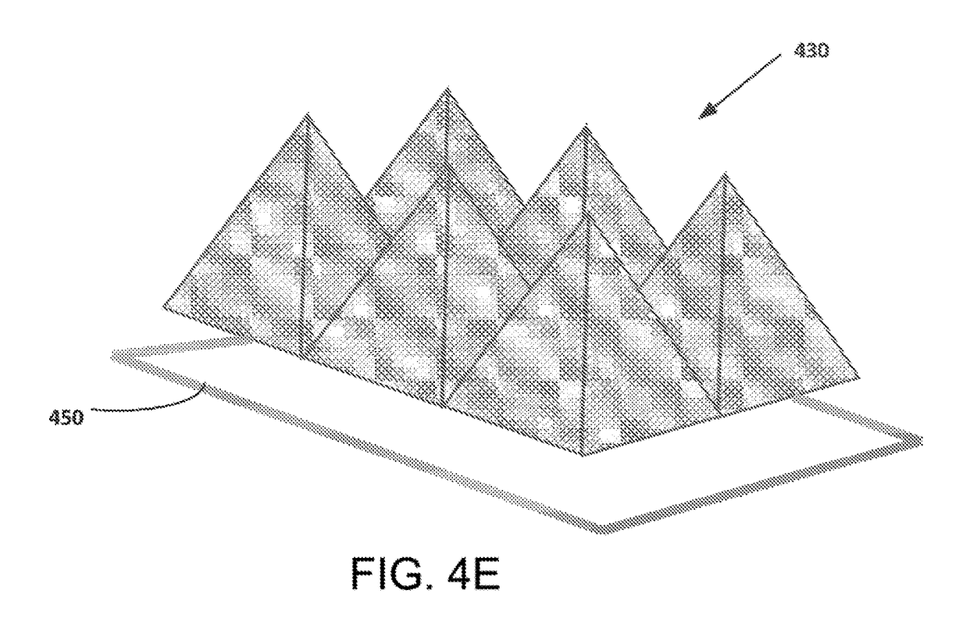

The array 430 of three-dimensional structures may be mounted on a heat sink 450 and thermally coupled to the heat sink using a thermally conductive bond or high temperature solder to enhance the heat dissipation properties of the free space absorber. In one embodiment, a high temperature solder is above 230° C., a low temperature solder is under 150° C., and manufacturers make solder alloys with melting temperature ranges between about 47° C.-1064° C. FIG. 4E shows the array 430 of pyramidal structures 410 attached to a heat sink 450.

The heat dissipation properties of the free space absorber shown in FIG. 4D is enhanced by the materials used in each wafer member 400. In example implementations, the wafer members 400 forming the three-dimensional structures on the free space absorber shown in FIGS. 3 and 4E may be made of materials used in the RF termination device 100 described with reference to FIGS. 1A and 2. Specifically, the wafer member 400 may be made of a slab of ceramic material having the metallized resistive film disposed on the outer surface of the free space absorber. The ceramic materials may include, for example: silicon dioxide, boron nitride, diamond, Beryllium Oxide, RBSN, Aluminum Nitride, Silicon Nitride, MACOR® material, Mullite, and Aluminum Oxide. The materials may be selected based on the desired characteristics above, and according to the list of materials in Table A.

It is noted that the materials listed above in Table A are provided as examples of materials that may be used in example implementations. The characteristics provided are also indicated to illustrate how different characteristics may be compared to select a ceramic material for a specific implementation. The list of materials in Table A is not intended to be limiting. Materials not listed may also be used in example implementations of either RF termination devices or free space absorbers.

Figure 5A:
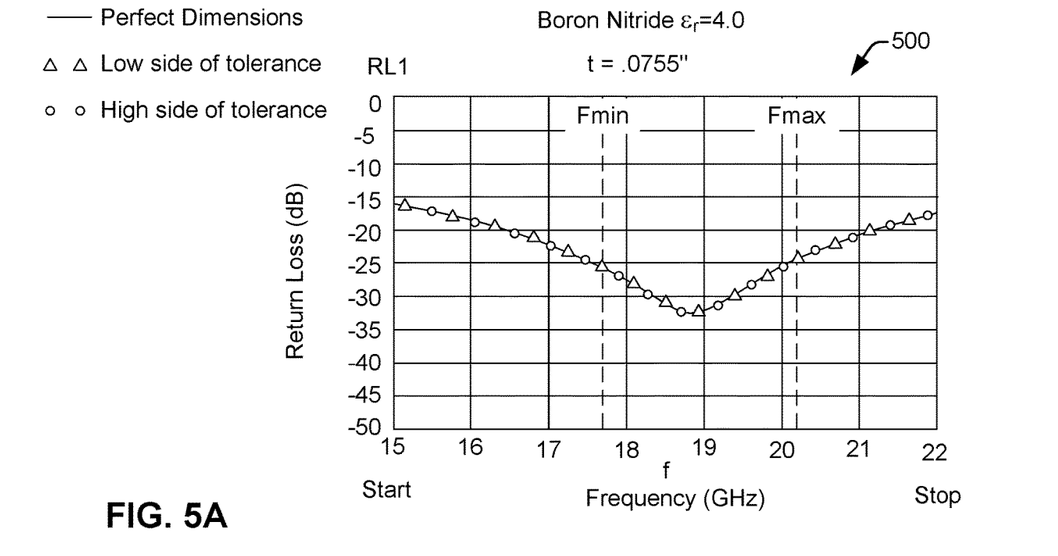
FIG. 5A is a graph of simulated results of an example RF termination device.
Figure 5B:
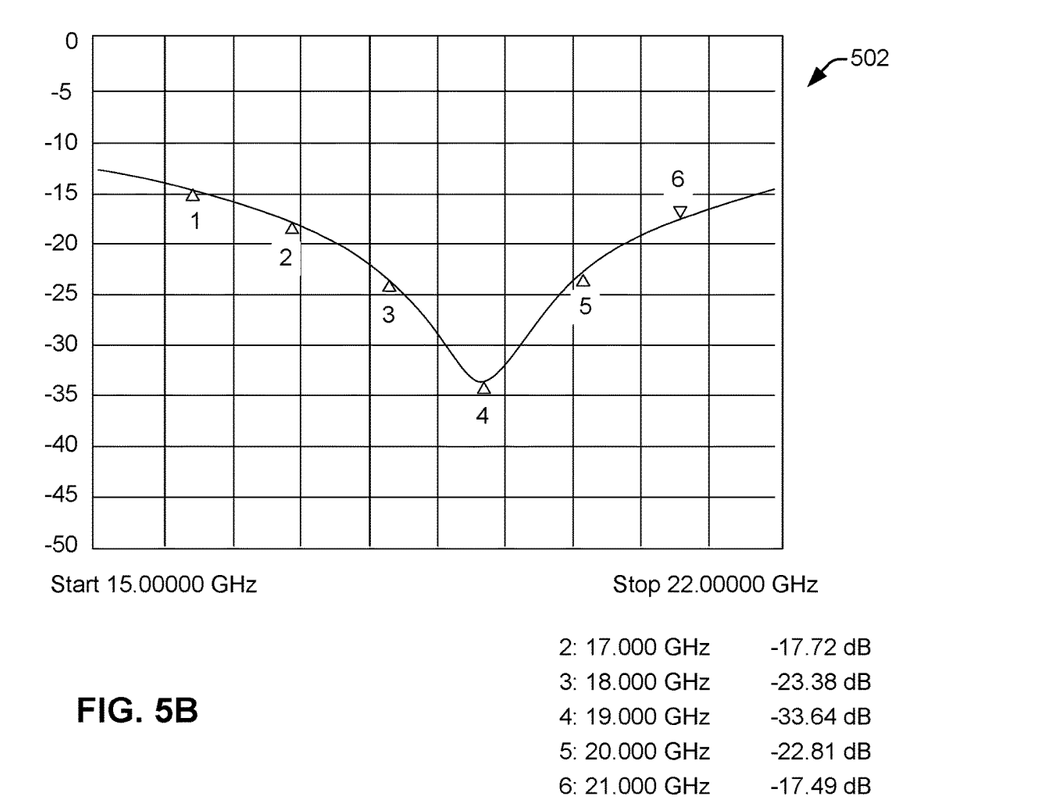
FIG. 5B is a graph of measured results of the example RF termination device of FIG. 5A.
Figure 5C:
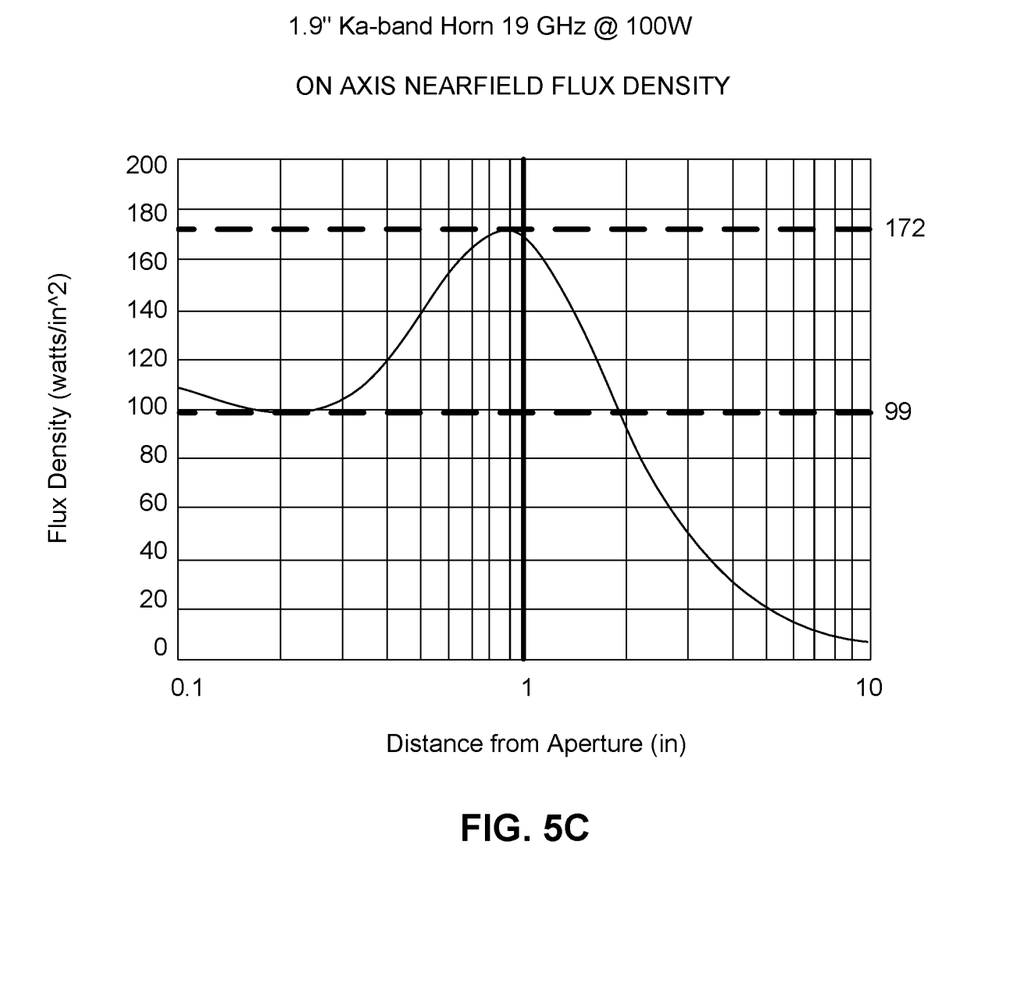
FIG. 5C is a graph showing simulated on-axis nearfield flux density of a radiating circular horn antenna.

An RF termination device constructed as described above in TABLE B was tested to determine its frequency response and its heat dissipating capabilities. FIGS. 5A and 5B show graphs indicating predicted 500 and measured 502 RF return loss response of a load consisting of the RF termination device similar to the example described above in TABLE B. FIG. 5C is a graph 510 showing the expected flux density of the example described in TABLE B. The tests on the RF termination device described in TABLE B show expected RF flux density at the load surface ranges between 99 watts/in$^2$ and 172 watts/in$^2$ with 19 GHz @ 100 watts input power. The load passed high power tests at ambient pressure as the heat sink measured 69 degrees C. in a 35 MPH airflow.

It is noted that in some applications, if required, a load similar to the RF termination device in TABLE B could tolerate much higher flux if the heat sink were electroformed directly on to the boron nitride wafer. All materials in the construction would then be inorganic, thermally conductive, and able to operate to a limit near 2000 degrees F. This construction may be a suitable configuration for high reliability high power waveguide loads that are required to tolerate extreme flux levels.

The disclosure presented herein may be considered in view of the following examples:

Example A

A method of manufacturing a radio frequency ("RF") radiative termination device comprising:
forming a planar wafer having a first surface and a second surface opposite the first surface, where the planar wafer is formed from an inorganic thermally conductive material;
forming a metallized resistive film on the first surface; and
forming a metallized reflective heat sink on the second surface.

Example B

The method of Example A where the step of forming the planar wafer comprises:
forming the planar wafer to have a thickness of λ/4 where λ is a wavelength of a selected RF signal.

Example C

The method of Example A where the step of forming the planar wafer comprises:
forming the planar wafer from a suitable ceramic material.

Example D

The method of Example A where the step of forming the planar wafer from a suitable ceramic material comprises:
selecting the ceramic material from a group consisting of Silicon Dioxide, boron nitride, diamond, Beryllium Oxide (99.5%), RBSN, Aluminum Nitride (99%), Silicon Nitride (Hot Pressed), Aluminum Oxide (99.9% Alumina).

Example E

The method of Example A where the step of forming the metallized reflective heat sink comprises forming the metallized reflective heat sink from aluminum or copper.

Example F

The method of Example A where the step of forming the metallized reflective heat sink comprises forming a base on the second surface of the planar wafer and forming a plurality of fins extending perpendicularly from the base.

Example G

The method of Example A where the step of forming the metallized reflective heat sink comprises attaching the metallized reflective heat sink to the planar wafer using a pressure sensitive adhesive.

Example H

The method of Example A where the step of forming the metallized reflective heat sink comprises electroplating a metallized reflective material on the second surface of the planar wafer.

Example I

The method of Example A where the step of forming the metallized reflective heat sink comprises vacuum depositing a metal on the second surface of the planar wafer.

Example J

The method of Example A where the step of forming the metallized resistive film comprises providing a metallized resistive material having dimensions where the termination impedance of the radiative termination device matches a system impedance when the radiative termination device terminates a waveguide.

Example K

The method of Example A where the step of forming the metallized resistive film comprises vacuum depositing a metal on the first surface of the planar wafer.

Example L

A thermally conductive free space radio frequency ("RF") absorber comprising:
a plurality of wafer members made of an inorganic thermally conductive material each having a bottom edge, the wafer members extending from the bottom edges to form a plurality of three-dimensional structures, where the bottom edges of the wafer members are substantially coplanar at a bottom end of the three-dimensional structures, the three-dimensional structures having an RF absorbing side extending from the substantially co-planar bottom edges;
a metallized resistive film disposed on an outer surface of the RF absorbing side of each three-dimensional structure; and
a metallized reflective heat sink attached to the three-dimensional structures at the substantially co-planar bottom edges.

Example M

The thermally conductive free space RF absorber of Example L where the metallized resistive film is made of either NiCr or stainless steel.

Example N

The thermally conductive free space RF absorber of Example L where the metallized reflective heat sink comprises a base attached to the bottom edges of the wafer members and a heat-sinking structure.

Example O

The thermally conductive free space RF absorber of Example N where the heat-sinking structure includes a plurality of fins extending perpendicularly from the base.

Example P

The thermally conductive free space RF absorber of Example N where the heat-sinking structure includes a plurality of liquid cooling channels.

Example Q

The thermally conductive free space RF absorber of Example N where the heat-sinking structure includes a heat pipe.

Example R

The thermally conductive free space RF absorber of Example N where the metallized reflective heat sink is made of aluminum or copper It will be understood that various aspects or details of the disclosure may be changed without departing from the scope of the disclosure. The above description is not exhaustive and does not limit the claims to the precise form disclosed herein. Furthermore, the above description is for the purpose of illustration only, and not for the purpose of limitation. Modifications and variations are possible in light of the above description or may be acquired from practicing the example implementations disclosed. The claims and their equivalents define the scope of the disclosure.

What is claimed is:
1. A radio frequency (RF) radiative termination device comprising:
a planar wafer comprising an inorganic thermally conductive material, the planar wafer having a first surface and a second surface distinct from the first surface and coupled to a waveguide or horn antenna to terminate the waveguide or the horn antenna;
a metallized resistive film disposed on the first surface; and
a free space absorber comprising RF absorption requirements, the free space absorber comprising:
a metallized reflective heat sink disposed on the second surface; and
a plurality of fins extending perpendicularly from the metallized reflective heat sink, each of the plurality of fins having a first end and a second end opposite the first end, the second end of each of the plurality of fins being coupled to the metallized reflective heat sink.

2. The RF radiative termination device of claim 1, wherein the metallized resistive film absorbs RF waves, and wherein the metallized reflective heat sink reflects RF waves.

3. The RF radiative termination device of claim 1, wherein the inorganic thermally conductive material is a ceramic material.

4. The RF radiative termination device of claim 1, wherein the metallized reflective heat sink is made of aluminum or copper.

5. The RF radiative termination device of claim 1, wherein the metallized reflective heat sink comprises a base extending across the second surface of the planar wafer, and wherein the metallized reflective heat sink comprises a heat-sinking structure.

6. The RF radiative termination device of claim 5, wherein the plurality of fins extend perpendicularly from the base.

7. The RF radiative termination device of claim 5 where the heat-sinking structure includes a plurality of liquid cooling channels.

8. The RF radiative termination device of claim 5 where the heat-sinking structure includes a heat pipe.

9. The RF radiative termination device of claim 1, wherein the metallized reflective heat sink is attached to the planar wafer using a pressure sensitive adhesive.

10. The RF radiative termination device of claim 1 where the metallized reflective heat sink is formed on the second surface of the planar wafer using electroplating or vacuum deposition.

11. The RF radiative termination device of claim 1, wherein the metallized resistive film is made of a metallized resistive material having dimensions, wherein the radiative termination device terminates device terminates the waveguide, and wherein a termination impedance of the radiative termination device matches a system impedance.

12. The RF radiative termination device of claim 11, wherein the metallized resistive film is formed on the planar wafer using vacuum deposition.

13. The RF radiative termination device of claim 1, wherein the metallized resistive film is made of either nickel-chromium (NiCr), stainless steel, or non-metal Carbon.

14. The RF radiative termination device of claim 1, wherein the planar wafer is formed with a thickness of $\lambda/4$.

15. A thermally conductive free space radio frequency ("RF") absorber comprising:
a plurality of wafer members made of an inorganic thermally conductive material, each wafer member having a bottom edge, the wafer members extending from the bottom edges to form a plurality of three-dimensional structures, where the bottom edges of the wafer members are substantially coplanar at a bottom end of the three-dimensional structures, the three-dimensional structures having an RF absorbing side extending from the substantially coplanar bottom edges, wherein a distance between each of the bottom edges of the wafer members is based on RF absorption requirements of the free space RF absorber;
a metallized resistive film disposed on an outer surface of the RF absorbing side of each three-dimensional structure; and
a metallized reflective heat sink attached to the three-dimensional structures at the substantially coplanar bottom edges.

16. The thermally conductive free space RF absorber of claim 15 where each wafer member includes a metal on the bottom edge.

17. The thermally conductive free space RF absorber of claim 16 where the metallized reflective heat sink is attached to the metal of the bottom edges by a solder or a a thermally conductive bond.

18. The thermally conductive free space RF absorber of claim 16 where the three-dimensional structures are pyramidal structures formed by joined structure-forming edges extending from the bottom edge of each wafer member.

19. The thermally conductive free space RF absorber of claim 15 where the inorganic thermally conductive material is a ceramic material.

20. The thermally conductive free space RF absorber of claim 19 where the ceramic material is a ceramic selected from a group consisting of Silicon Dioxide, boron nitride, diamond, Beryllium Oxide, Silicon Nitride Reaction Bonded Silicon Nitride (RBSN), Aluminum Nitride, Silicon Nitride-Hot Pressed, and Aluminum Oxide.

* * * * *